United States Patent
Chu et al.

(10) Patent No.: US 10,762,845 B2
(45) Date of Patent: Sep. 1, 2020

(54) COMPENSATION METHOD FOR DISPLAY PANEL, DRIVING DEVICE, DISPLAY DEVICE, AND STORAGE MEDIUM

(71) Applicant: BOE TECHNOLOGY GROUP CO., LTD., Beijing (CN)

(72) Inventors: Ming I Chu, Beijing (CN); Zhongyuan Wu, Beijing (CN); Fei Yang, Beijing (CN); Song Meng, Beijing (CN); Danna Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/108,543

(22) Filed: Aug. 22, 2018

(65) Prior Publication Data

US 2019/0147801 A1   May 16, 2019

(30) Foreign Application Priority Data

Nov. 15, 2017   (CN) .......................... 2017 1 1130675

(51) Int. Cl.
*G09G 3/36* (2006.01)
*G09G 3/3258* (2016.01)
*H01L 27/32* (2006.01)

(52) U.S. Cl.
CPC ... *G09G 3/3258* (2013.01); *G09G 2310/0264* (2013.01); *G09G 2320/0233* (2013.01); *H01L 27/3244* (2013.01)

(58) Field of Classification Search
None
See application file for complete search history.

(56) References Cited

U.S. PATENT DOCUMENTS

| | | | |
|---|---|---|---|
| 2008/0246709 A1 | 10/2008 | Mori | |
| 2014/0152633 A1 | 6/2014 | Park et al. | |
| 2014/0253603 A1* | 9/2014 | Kwon | G09G 3/3208 345/690 |
| 2016/0321976 A1 | 11/2016 | Kim et al. | |

FOREIGN PATENT DOCUMENTS

| | | |
|---|---|---|
| CN | 101261821 A | 9/2008 |
| CN | 101281716 A | 10/2008 |
| CN | 102842297 A | 12/2012 |
| CN | 103854603 A | 6/2014 |
| CN | 104464626 A | 3/2015 |
| CN | 105575314 A | 5/2016 |
| CN | 106856086 A | 6/2017 |

OTHER PUBLICATIONS

Chinese Office Action in Chinese Application No. 201711130675.8, dated May 15, 2019 with English translation.

* cited by examiner

*Primary Examiner* — Roy P Rabindranath
(74) *Attorney, Agent, or Firm* — Collard & Roe, P.C.

(57) ABSTRACT

A compensation method for an electroluminescent display panel, a driving device, a display device, and a storage medium are provided. The compensation method includes: receiving a first display data signal; performing an optical compensation operation on the first display data signal to obtain a second display data signal; performing an electrical compensation operation on the second display data signal to obtain a third display data signal; and outputting the third display data signal for display.

12 Claims, 8 Drawing Sheets

COMPENSATION METHOD FOR DISPLAY PANEL, DRIVING DEVICE, DISPLAY DEVICE, AND STORAGE MEDIUM

CROSS-REFERENCE TO RELATED APPLICATIONS

The application claims priority to the Chinese patent application No. 201711130675.8, filed on Nov. 15, 2017, the entire disclosure of which is incorporated herein by reference as part of the present application.

TECHNICAL FIELD

Embodiments of the present disclosure relate to a compensation method for an electroluminescent display panel, a driving device, a display device, and a storage medium.

BACKGROUND

As current-type light emitting devices, electroluminescent elements have been increasingly used in display panels. Due to the self-luminous property, electroluminescent display panels do not need a backlight source, and have the advantages of high contrast ratio, thin thickness, wide viewing angle, fast response speed, flexibility, simple structure and process, and the like. Therefore, the electroluminescent display panels gradually become the mainstream display panels of the next generation.

SUMMARY

At least one embodiment of the present disclosure provides a compensation method for an electroluminescent display panel, comprising: receiving a first display data signal; performing an optical compensation operation on the first display data signal to obtain a second display data signal; performing an electrical compensation operation on the second display data signal to obtain a third display data signal; and outputting the third display data signal for display.

For example, in the compensation method for an electroluminescent display panel provided by an embodiment of the present disclosure, the optical compensation operation comprises: obtaining a brightness lookup table; according to the first display data signal, obtaining first transformation brightness corresponding to the first display data signal from the brightness lookup table; obtaining fitting parameters; and obtaining the second display data signal according to the first transformation brightness and the fitting parameters.

For example, in the compensation method for an electroluminescent display panel provided by an embodiment of the present disclosure, the second display data signal is expressed as: $\sqrt{L'}=k1 \leq \sqrt{Lo}+k2$, where $\sqrt{L'}$ represents the second display data signal, $\sqrt{Lo}$ represents the first transformation brightness, and k1 and k2 represent the fitting parameters.

For example, in the compensation method for an electroluminescent display panel provided by an embodiment of the present disclosure, the electrical compensation operation comprises: obtaining electrical compensation parameters; and obtaining the third display data signal according to the second display data signal and the electrical compensation parameters.

For example, in the compensation method for an electroluminescent display panel provided by an embodiment of the present disclosure, the third display data signal is expressed as: $GL_e=k \times \sqrt{L'}+Vth$, where $GL_e$ represents the third display data signal, $\sqrt{L'}$ represents the second display data signal, and Vth and k represent the electrical compensation parameters.

For example, in the compensation method for an electroluminescent display panel provided by an embodiment of the present disclosure, the electrical compensation operation comprises: obtaining electrical compensation parameters; and obtaining the third display data signal according to the second display data signal and the electrical compensation parameters.

For example, in the compensation method for an electroluminescent display panel provided by an embodiment of the present disclosure, the third display data signal is expressed as: $GL_e=k \times \sqrt{L'}+Vth$, where $GL_e$ represents the third display data signal, $\sqrt{L'}$ represents the second display data signal, and Vth and k represent the electrical compensation parameters.

At least one embodiment of the present disclosure further provides a compensation method for an electroluminescent display panel, comprising: performing electrical compensation detection on the electroluminescent display panel to obtain electrical compensation parameters; and enabling the electroluminescent display panel to display based on the electrical compensation parameters, and performing optical compensation detection on the electroluminescent display panel to obtain optical compensation parameters.

For example, in the compensation method for an electroluminescent display panel provided by an embodiment of the present disclosure, a sub-pixel of the electroluminescent display panel comprises a driving circuit, the driving circuit comprises a driving transistor, the electrical compensation parameters comprise a threshold voltage of the driving transistor, and performing the electrical compensation detection to obtain the electrical compensation parameters, comprises: applying a first voltage to a gate electrode of the driving transistor of the driving circuit; obtaining a first sensing voltage of a first electrode of the driving transistor after applying the first voltage for a predetermined duration; and obtaining the threshold voltage of the driving transistor according to the first sensing voltage.

For example, in the compensation method for an electroluminescent display panel provided by an embodiment of the present disclosure, the electrical compensation parameters further comprise a mobility variation, and performing the electrical compensation detection to obtain the electrical compensation parameters, further comprises: obtaining a second voltage according to the threshold voltage, and applying the second voltage to the gate electrode of the driving transistor; obtaining a second sensing voltage of the first electrode of the driving transistor; and obtaining the mobility variation of the driving transistor according to the second sensing voltage.

For example, in the compensation method for an electroluminescent display panel provided by an embodiment of the present disclosure, the optical compensation parameters comprise a brightness lookup table, and performing the optical compensation detection to obtain the optical compensation parameters, comprises: inputting actual gray-scales and measuring ideal brightness of a test area under the actual gray-scales; transforming the actual gray-scales to first transformation brightness through a brightness transformation formula; and establishing the brightness lookup table according to the ideal brightness and the first transformation brightness.

For example, in the compensation method for an electroluminescent display panel provided by an embodiment of the present disclosure, the brightness lookup table is expressed as: $\sqrt{L_0}$=LUTD(L), where $\sqrt{L_0}$ represents the first transformation brightness, L represents the ideal brightness, and LUTD represents the brightness lookup table.

For example, in the compensation method for an electroluminescent display panel provided by an embodiment of the present disclosure, the optical compensation parameters further comprise fitting parameters, and performing the optical compensation detection to obtain the optical compensation parameters, further comprises: inputting optical measurement gray-scales to enable a sub-pixel of the electroluminescent display panel to display with the ideal brightness; transforming the optical measurement gray-scales to characterizing brightness by the brightness transformation formula; according to the characterizing brightness, looking up, in the brightness lookup table, second transformation brightness corresponding to the characterizing brightness; and obtaining the fitting parameters according to the second transformation brightness and the first transformation brightness.

For example, the compensation method for an electroluminescent display panel provided by an embodiment of the present disclosure further comprises: before performing the electrical compensation detection on the electroluminescent display panel, correcting an analog-to-digital converter, which is used for processing display data, of the electroluminescent display panel.

For example, the compensation method for an electroluminescent display panel provided by an embodiment of the present disclosure further comprises: before correcting the analog-to-digital converter, measuring optical characteristic parameters of the electroluminescent display panel.

At least one embodiment of the present disclosure further provides a driving device, comprising: a processor; a memory; and one or more modules which are stored in the memory and configured to be executed by the processor, and comprise instructions for implementing the compensation method for an electroluminescent display panel provided by any one of the embodiments of the present disclosure.

At least one embodiment of the present disclosure further provides a driving device, comprising: a signal receiving circuit, configured to receive a first display data signal; an optical compensation circuit, configured to perform an optical compensation operation on the first display data signal to obtain a second display data signal; an electrical compensation circuit, configured to perform an electrical compensation operation on the second display data signal to obtain a third display data signal; and a signal output circuit, configured to output the third display data signal for display.

At least one embodiment of the present disclosure further provides an electroluminescent display device, comprising the driving device provided by any one of the embodiments of the present disclosure.

For example, the electroluminescent display device provided by an embodiment of the present disclosure further comprises a data driver and a display panel, wherein the driving device is coupled to the data driver to provide the third display data signal to the data driver, and the data driver is coupled to the display panel to apply data voltages to the display panel.

At least one embodiment of the present disclosure further provides a storage medium, for non-transitorily storing computer executable instructions, when the computer executable instructions are executed by a computer, the compensation method for an electroluminescent display panel provided by any one of the embodiments of the present disclosure is implemented.

BRIEF DESCRIPTION OF THE DRAWINGS

In order to clearly illustrate the technical solution of the embodiments of the disclosure, the drawings of the embodiments will be briefly described in the following. It is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Currently, electroluminescent display panels mainly comprise organic light emitting diode (OLED) display panels. According to different driving modes, OLED display panels are classified into two types: an active-matrix OLED (AMOLED) and a passive-matrix OLED (PMOELD). A pixel circuit of the AMOLED may comprise an OLED device, a selection transistor, a driving transistor, and a storage capacitor. The selection transistor is turned on/off through a scanning signal, so that a data voltage corresponding to display data may be charged to the storage capacitor through the selection transistor. Therefore, a conduction degree of the driving transistor is controlled by the data voltage stored in the storage capacitor, thereby controlling a current flowing through the OLED device, and adjusting the brightness of the OLED device.

The process stability of a transistor is a major factor that affects a display image. Threshold voltages and mobility of driving transistors among a plurality of pixels have differences, resulting in that currents which are provided to various pixels are different, so that brightness deviation occurs, brightness uniformity of a display screen decreases, and spots or patterns of regions are even generated. This phenomenon is particularly obvious for large-sized electroluminescent display panels. Therefore, compensation techniques are needed to enable brightness of pixels to reach desired values.

Compensation methods for pixels may comprise an internal compensation method and an external compensation method. The internal compensation method does not meet the brightness compensation of all display panels, so an compensation effect needs to be ameliorated by the external compensation method. According to different data extraction methods, the external compensation method may comprise an electrical compensation mode and an optical compensation mode. However, each of the electrical compensation mode and the optical compensation mode has different advantages and disadvantages, and the independent compensation effect is limited.

At least one embodiment of the present disclosure provides a compensation method for an electroluminescent display panel, a driving device, a display device, and a storage medium. The compensation method is capable of combining advantages of the optical compensation mode and the electrical compensation mode, improving the compensation effect, improving the display uniformity of the electroluminescence display panel, and increasing the user's comfort.

The embodiments of the present disclosure are described in detail below with reference to the accompanying drawings. It should be noted that the same reference symbols in different drawings are used to represent the same elements that has been described.

At least one embodiment of the present disclosure provides a compensation method for an electroluminescent display panel, which comprises: receiving a first display data signal; performing an optical compensation operation on the first display data signal to obtain a second display data signal; performing an electrical compensation operation on the second display data signal to obtain a third display data signal; and outputting the third display data signal for display.

Figure 1:
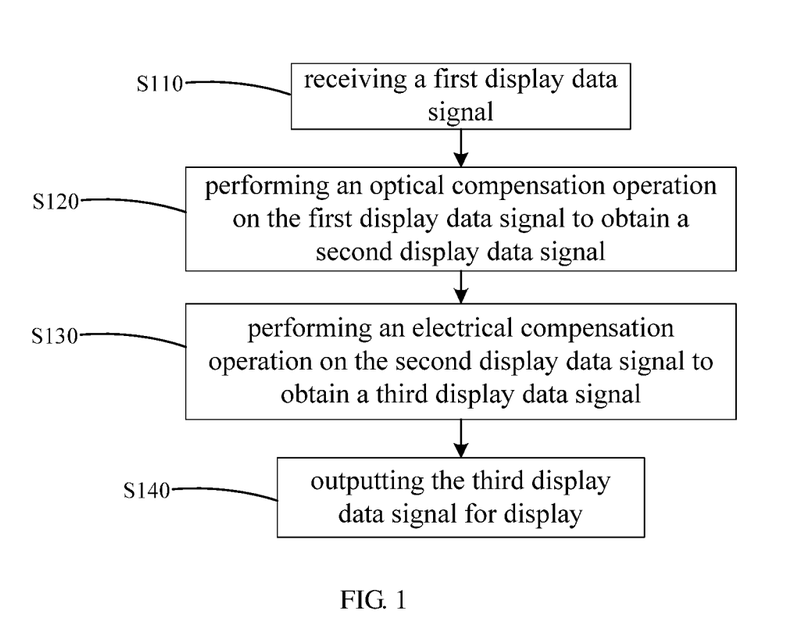
FIG. 1 is a flow chart of a compensation method for an electroluminescence display panel provided by an embodiment of the present disclosure.

FIG. 1 is a flow chart of a compensation method for an electroluminescence display panel provided by an embodiment of the present disclosure. The compensation method illustrated in FIG. 1 may be performed when the electroluminescence display panel operates, so that display data of the display panel can be compensated in real time, thereby improving the display uniformity of the display panel, and obtaining an relatively high quality display effect. An optical compensation operation process in the compensation method may be at least partially referred to FIG. 2, and an electrical compensation operation process in the compensation method may be at least partially referred to FIG. 3.

Referring to FIG. 1, the compensation method provided by an embodiment of the present disclosure comprises the following steps S110-S140:

Step S110: receiving a first display data signal;

Step S120: performing an optical compensation operation on the first display data signal to obtain a second display data signal;

Step S130: performing an electrical compensation operation on the second display data signal to obtain a third display data signal; and Step S140: outputting the third display data signal for display.

For example, in the embodiment of the present disclosure, the first display data signal described in the step S110 may be an image input signal or a picture input signal, which may be a gray-scale data signal or a brightness data signal. The first display data signal may be obtained through receiving and decoding by a signal receiving circuit. For example, the receiving and decoding may be implemented by a dedicated signal receiving device or other suitable devices, for example, the signal receiving circuit may refer to a signal receiving device used in a current display device, such as a wireless receiving circuit, a wired cable receiving circuit, a network interface receiving circuit, a universal serial bus (USB) or high definition multimedia interface (HDMI) receiving circuit, a corresponding modem, and the like.

For example, the optical compensation operation described in the step S120 is configured to optically compensate for the first display data signal. In a case where the first display data signal is a gray-scale data signal, the optical compensation operation may comprise: transforming the gray-scale data signal into a brightness data signal, obtaining first transformation brightness according to the brightness data signal through a brightness lookup table, and obtaining the second display data signal according to the first transformation brightness and fitting parameters. The first transformation brightness corresponds to the brightness data signal, so that the first transformation brightness corresponds to the first display data signal. The second display data signal represents a data signal obtained after optically compensating for the first display data signal.

For example, the optical compensation operation may be implemented through an optical compensation circuit, and may also be implemented through a central processing unit (CPU) or other processing units with other forms having data processing capabilities or instruction execution capabilities. The processing units may be a general processor or a dedicated processor, and may be a processor based on an X86 or an advanced reduced instruction set computer machine (ARM) architecture, and the like.

For example, the electrical compensation operation described in the step S130 is configured to electrically compensate for the second display data signal according to electrical compensation parameters to obtain the third display data signal. The electrical compensation operation may be implemented through an electrical compensation circuit, and may also be implemented through a central processing unit (CPU) or other processing units with other forms having data processing capabilities or instruction execution capabilities described above.

For example, the third display data signal described in the step S140 is an image output signal or a picture output signal after the optical compensation and the electrical compensation, and the third display data signal may be input to a pixel unit in the display panel for display.

When display data signals are input to the display panel, the display data signals may be written to a pixel array of the display panel in the way of progressive scanning or interlaced scanning, thereby displaying the image in a frame manner. For example, the third display data signal may be outputted by a signal output circuit, or may be outputted by a dedicated signal output device or other suitable devices, and the signal output circuit may refer to a signal output device used in the current display device.

It should be noted that, in the embodiments of the present disclosure, the compensation method may comprise more or less operations, which may be performed sequentially or in parallel, and the embodiments of the present disclosure are not limited thereto.

Figure 2:
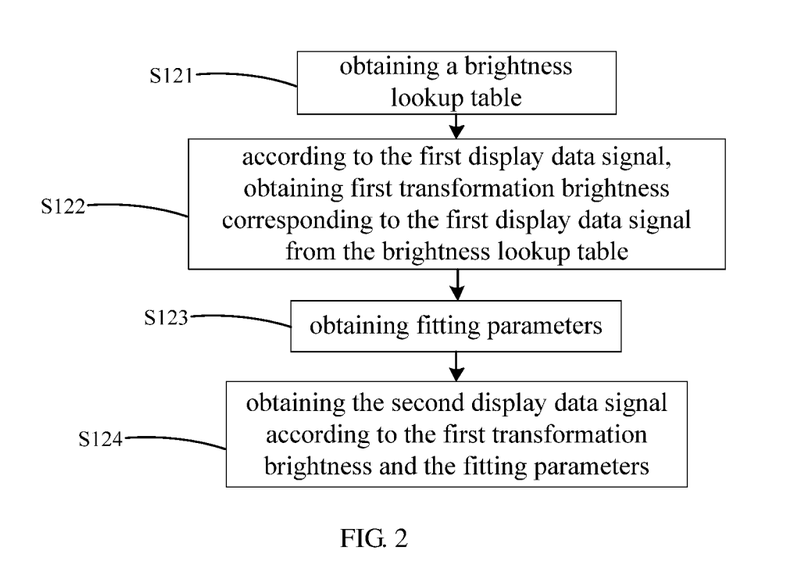
FIG. 2 is a flow chart of an optical compensation operation in a compensation method for an electroluminescence display panel provided by an embodiment of the present disclosure.

FIG. 2 is a flow chart of an example of the optical compensation operation in the compensation method illustrated in FIG. 1. That is, FIG. 2 is an operational flow chart of an example of the step S120 in FIG. 1. The optical compensation operation may compensate for the first display data signal based on optical compensation parameters.

Referring to FIG. 2, the optical compensation operation comprises the following steps:

Step S121: obtaining a brightness lookup table;

Step S122: according to the first display data signal, obtaining first transformation brightness corresponding to the first display data signal from the brightness lookup table;

Step S123: obtaining fitting parameters; and

Step 124: obtaining the second display data signal according to the first transformation brightness and the fitting parameters.

For example, the optical compensation parameters may comprise a brightness lookup table that represents the correspondence between ideal brightness and the first transformation brightness. In the step S121, the brightness lookup table may be obtained through measuring and calculating before the optical compensation operation. For example, the brightness lookup table may be obtained through measuring and calculating before or after the electroluminescent display panel is shipped from the factory. For example, the brightness lookup table may be stored in a memory of the electroluminescent display panel, and the brightness lookup table can be read from the memory by the electroluminescent display panel when needed. The memory may comprise one or more computer program products, which may comprise computer readable storage media of various forms, such as volatile memory or nonvolatile memory.

For example, in the step S122, when the first display data signal is a gray-scale data signal, firstly, the first display data signal needs to be transformed into corresponding ideal brightness (i.e., a corresponding brightness data signal) according to a brightness transformation formula, and then the first transformation brightness is looked up in the brightness lookup table according to the corresponding ideal brightness. Therefore, the first transformation brightness corresponds to the first display data signal. The brightness transformation formula may be expressed as follow:

$$L = \left(\frac{GL}{2^n}\right)^\gamma \times (2^i - 1),$$

where L represents the ideal brightness corresponding to the first display data signal, GL represents the gray-scale data signal (i.e., the first display data signal), n represents the precision bits, γ represents the gamma curve factor, and i represents the operation bits. The values of n, γ, and i may be set according to actual needs, or may be selected in a conventional manner in the art. For example, n=10, γ=2.2, and i=20, which are not limited in the embodiments of the present disclosure. When the first display data signal is a brightness data signal, the first transformation brightness corresponding to the first display data signal may be directly looked up according to the brightness lookup table, that is, the above step of calculating by using the brightness transformation formula may be omitted.

For example, the optical compensation parameters may also comprise fitting parameters. In the step S123, the fitting parameters may be obtained through measuring and calculating before the optical compensation operation. For example, the optical compensation parameters may be obtained through measuring and calculating before or after the electroluminescent display panel is shipped from the factory. For example, the optical compensation parameters may also be stored in the memory of the electroluminescent display panel, and the optical compensation parameters can be read from the memory by the electroluminescent display panel when needed.

For example, in the step S124, the second display data signal is calculated and obtained according to the first transformation brightness and the fitting parameters. The fitting parameters may be obtained by linear fitting, so the second display data signal is also calculated by using a linear fitting way. Thereby, the second display data signal is expressed as:

$$\sqrt{L'} = k1 \times \sqrt{Lo} + k2,$$

where $\sqrt{L'}$ represents the second display data signal, $\sqrt{Lo}$ represents the first transformation brightness, and k1 and k2 represent the fitting parameters. The second display data signal is the data signal after optically compensating for the first display data signal. It should be noted that, in a case where the fitting parameters are obtained by using other fitting methods except the linear fitting, the calculation formula of the second display data signal is determined according to the adopted specific fitting method, which is not limited in the embodiments of the present disclosure.

Figure 3:
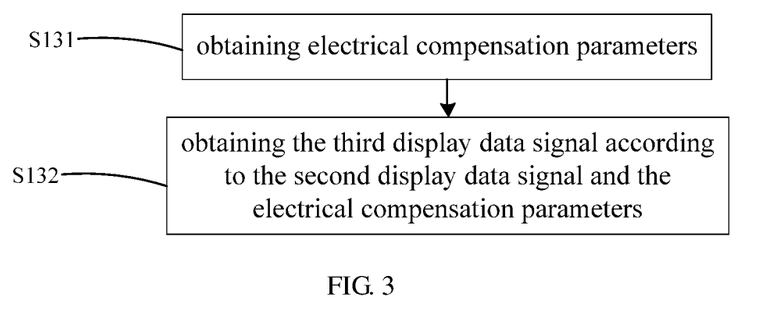
FIG. 3 is a flow chart of an electrical compensation operation in a compensation method for an electroluminescence display panel provided by an embodiment of the present disclosure.

FIG. 3 is a flow chart of an example of the electrical compensation operation in the compensation method illustrated in FIG. 1. That is, FIG. 3 is an operational flow chart of an example of the step S130 in FIG. 1. The electrical compensation operation may compensate for the second display data signal, which has been optically compensated before, according to electrical compensation parameters.

Referring to FIG. 3, the electrical compensation operation comprises the following steps:

Step S131: obtaining electrical compensation parameters; and

Step S132: obtaining the third display data signal according to the second display data signal and the electrical compensation parameters.

Figure 6:
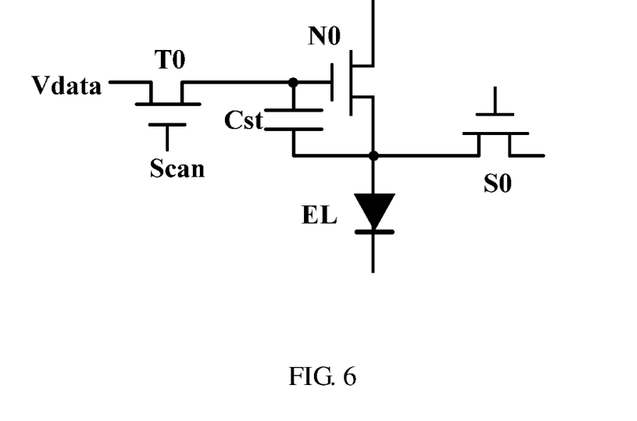
FIG. 6 is a schematic structural diagram of a driving circuit provided by an embodiment of the present disclosure.

FIG. 6 is a schematic structural diagram of a driving circuit provided by an embodiment of the present disclosure.

For example, as illustrated in FIG. 6, the electroluminescent display panel comprises a plurality of sub-pixels, and each sub-pixel comprises a driving circuit and a light emitting device EL. The driving circuit is configured to drive the light emitting device EL to emit light, and the driving circuit comprises a driving transistor N0, a selection transistor T0, and a storage capacitor Cst. The driving transistor N0 and the selection transistor T0 may be N-type transistors or P-type transistors as needed. The light emitting device EL may be an organic light emitting device, and the organic light emitting device may be, for example, an organic light emitting diode, but the embodiments of the present disclosure are not limited thereto. The light emitting devices EL, for example, may use different luminescent materials to emit light of different colors for achieving color illuminating. The driving circuit may be applied to the external electrical compensation. The driving circuit of the sub-pixel of the display panel of the embodiments of the present disclosure is not limited to the case illustrated in FIG. 6. For example, the driving circuit may further comprise more transistors or capacitors, and the driving circuit may further comprise an internal compensation circuit and the like, and the embodiments of the present disclosure are not limited thereto.

For example, the electrical compensation parameters described in the step S131 comprise, but are not limited to, a threshold voltage and the mobility variation of the driving transistor N0. The electrical compensation parameters may be obtained through measuring and calculating before the electrical compensation operation. For example, the electrical compensation parameters may be obtained through measuring and calculating before or after the electroluminescent display panel is shipped from the factory. For example, the electrical compensation parameters may also be stored in the memory of the electroluminescent display panel, and the electrical compensation parameters can be read from the memory by the electroluminescent display panel when needed.

For example, in the step S132, the third display data signal may be calculated and obtained according to the second display data signal and the electrical compensation parameters. For example, in an example, the electrical compensation parameters comprise the threshold voltage and the mobility variation of the driving transistor N0, and the third display data signal is expressed as:

$$GL_e = k \times \sqrt{L} + V\text{th},$$

where $GL_e$ represents the third display data signal, $V\text{th}$ represents the threshold voltage, and k represents the mobility variation. Therefore, the third display data signal is a data signal after the optical compensation and the electrical compensation are performed on the first display data signal.

The optical compensation mode is capable of compensating for the display non-uniformity, and the method of the optical compensation mode is flexible and simple. The electric compensation mode may achieve real-time compensation, and is capable of compensating for the residual image generated in the display panel during usage and improving the service life of the product. By performing the optical compensation and the electrical compensation on the first display data signal (e.g., the image input signal) through the compensation method illustrated in FIG. 1, FIG. 2, and FIG. 3, the advantages of the optical compensation mode and the electrical compensation mode are combined. That is, the compensation method provided by the embodiments of the present disclosure can compensate for the display non-uniformity and achieving the real-time compensation, and a operation process of performing the optical compensation before the electrical compensation can enhance the effect of the real-time compensation and improve the precision of the compensation result, thereby improving the comprehensive compensation effect and the display quality.

Figure 4:
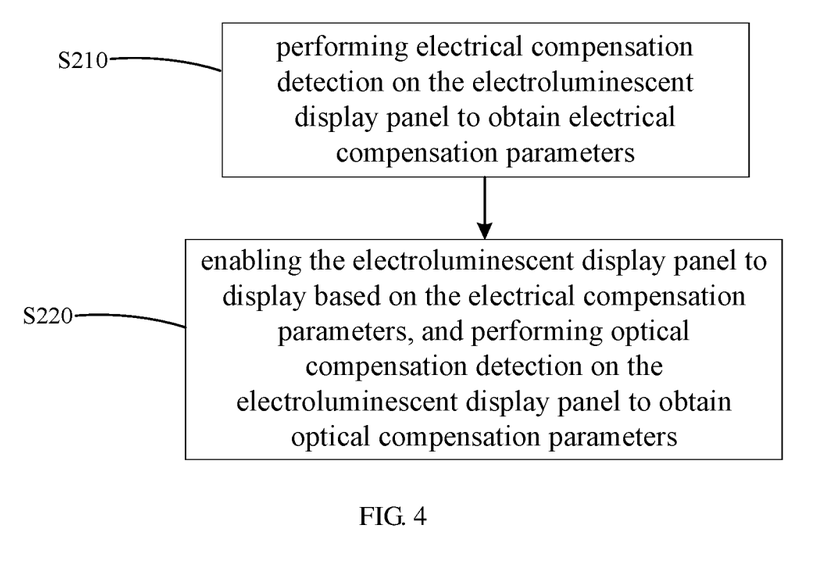
FIG. 4 is a flow chart of another compensation method for an electroluminescence display panel provided by an embodiment of the present disclosure.

FIG. 4 is a flow chart of another compensation method for an electroluminescent display panel provided by an embodiment of the present disclosure. The compensation method illustrated in FIG. 4 may be performed before the electroluminescent display panel is shipped from the factory, so as to obtain the optical compensation parameters and the electrical compensation parameters, which are pre-stored in the memory of the driving device (for example, the driving chip) of the display panel and can be used by the display panel during the display process in the future. An electrical compensation detection process in the compensation method may at least partially refer to FIG. 5, and an optical compensation detection process in the compensation method may be at least partially referred to FIGS. 7 and 9.

Referring to FIG. 4, the compensation method in this embodiment comprises the following steps S210-S220:

Step S210: performing electrical compensation detection on the electroluminescent display panel to obtain electrical compensation parameters; and Step S220: enabling the electroluminescent display panel to display based on the electrical compensation parameters, and performing optical compensation detection on the electroluminescent display panel to obtain optical compensation parameters.

For example, the electrical compensation detection described in the step S210 is configured to detect the electrical compensation parameters. The electrical compensation parameters comprise, but are not limited to, the threshold voltage and the mobility variation of the driving transistor. The optical compensation detection described in the step S220 is performed after the above-described electrical compensation detection and is used for detecting the optical compensation parameters. The optical compensation parameters comprise, but are not limited to, the brightness lookup table and the fitting parameters. For example, the electrical compensation parameters and the optical compensation parameters may be stored in the memory of the electroluminescent display panel.

It should be noted that, in the step S220, enabling the electroluminescent display panel to display based on the electrical compensation parameters may comprise: performing the electrical compensation on the display data signal of the electroluminescent display panel to obtain an electrical compensated display data signal; and inputting the electrical compensated display data signal to the display panel for display.

Figure 5:
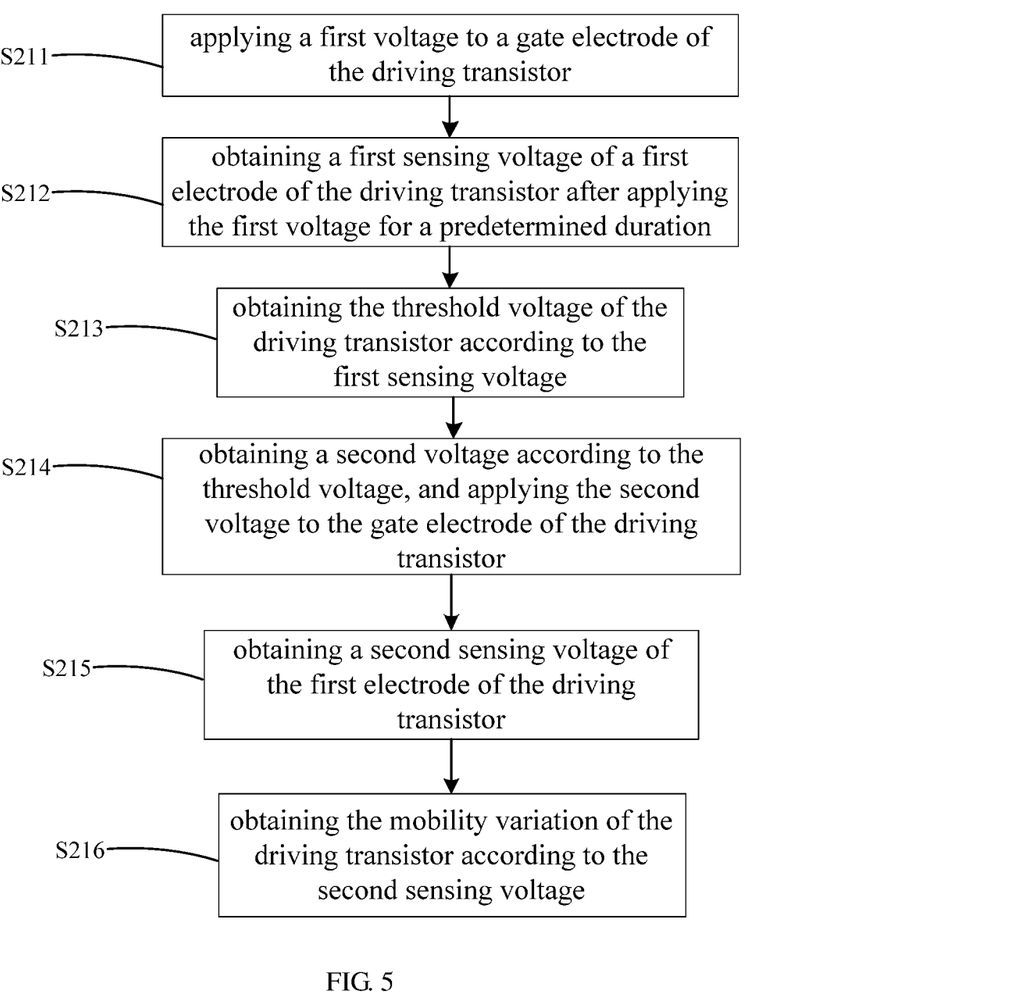
FIG. 5 is a flow chart of electrical compensation detection in another compensation method for an electroluminescence display panel provided by an embodiment of the present disclosure.

FIG. 5 is a flow chart of an example of the electrical compensation detection in the compensation method illustrated in FIG. 4. That is, FIG. 5 is an operational flow chart of an example of the step S210 in FIG. 4. Referring to FIG. 5, the example of the electrical compensation detection comprises the following steps:

Step S211: applying a first voltage to a gate electrode of the driving transistor;

Step S212: obtaining a first sensing voltage of a first electrode of the driving transistor after applying the first voltage for a predetermined duration;

Step S213: obtaining the threshold voltage of the driving transistor according to the first sensing voltage;

Step S214: obtaining a second voltage according to the threshold voltage, and applying the second voltage to the gate electrode of the driving transistor;

Step S215: obtaining a second sensing voltage of the first electrode of the driving transistor; and Step S216: obtaining the mobility variation of the driving transistor according to the second sensing voltage.

For example, in the step S211, as illustrated in FIG. 6, a sub-pixel of the electroluminescent display panel comprises a driving circuit, the driving circuit comprises a driving transistor N0, and the driving transistor N0 may be a thin film transistor. The first voltage is a gate electrode voltage that enables the driving transistor N0 to be in a saturation state.

For example, the predetermined duration described in the step S212 refers to the duration during which the driving transistor enters the saturated state, that is, the needed time until the driving transistor enters the saturated state after the first voltage is applied to the driving transistor. As illustrated in FIG. 6, in order to achieve the electrical compensation function, an exemplary driving circuit adopts a 3T1C (3 transistors and 1 capacitor) pixel driving circuit, that is, a sensing transistor S0 is added on the basis of an original 2T1C circuit. A first terminal of the sensing transistor S0 is connected to a source electrode of the driving transistor N0, and a second terminal of the sensing transistor S0 is connected to a detection circuit (not illustrated) through a sensing line. For example, the first electrode may be the source electrode of the driving transistor N0, and a first voltage Vdata (for example, 3V) is applied to a gate electrode of the driving transistor N0. After the driving transistor N0 is turned on, the driving transistor N0 discharges to the detection circuit through the sensing transistor S0 to change the electric potential of the source electrode of the driving transistor N0. When a voltage Vs of the source electrode of the driving transistor N0 is equal to the difference between a voltage Vg of the gate electrode of the driving transistor N0 (that is, the first voltage Vdata) and the threshold voltage Vth of the driving transistor N0, the driving transistor N0 is turned off. At this time, after the driving transistor N0 is turned off, the voltage of the first electrode (i.e., the source electrode) of the driving transistor N0 can be read through the turned-on sensing transistor S0, and the voltage of the first electrode serves as the first sensing voltage Vs. After the voltage Vs of the source electrode of the turned-off driving transistor N0 is obtained, the threshold voltage Vth of the driving transistor N0 can be obtained, that is, Vth=Vg−Vs.

It should be noted that the first electrode may also be the drain electrode of the driving transistor as needed, which is not limited in the embodiments of the present disclosure.

For example, in the step S214, the second voltage is expressed as:

$$V_{data}' = V_{data} + V\text{th},$$

where $V_{data}'$ represents the second voltage, and $V_{data}$ represents the data voltage. The second voltage comprises the threshold voltage of the driving transistor, and when the second voltage is applied to the gate electrode of the driving transistor, the threshold voltage of the driving transistor is compensated. At this time, the second sensing voltage detected is only relevant to the mobility. The mobility variation can be obtained by comparing the second sensing voltage with a preset reference value.

It should be noted that, in the embodiments of the present disclosure, the detection method of the threshold voltage and the mobility variation is not limited to the method described above, and may be determined according to actual needs. The process of the electrical compensation detection is not limited to the steps and sequence described above, may comprise more steps, and may also comprise fewer step; and the sequence of the steps may also be determined according to needs. The embodiments of the present disclosure are not limited thereto.

Figure 7:
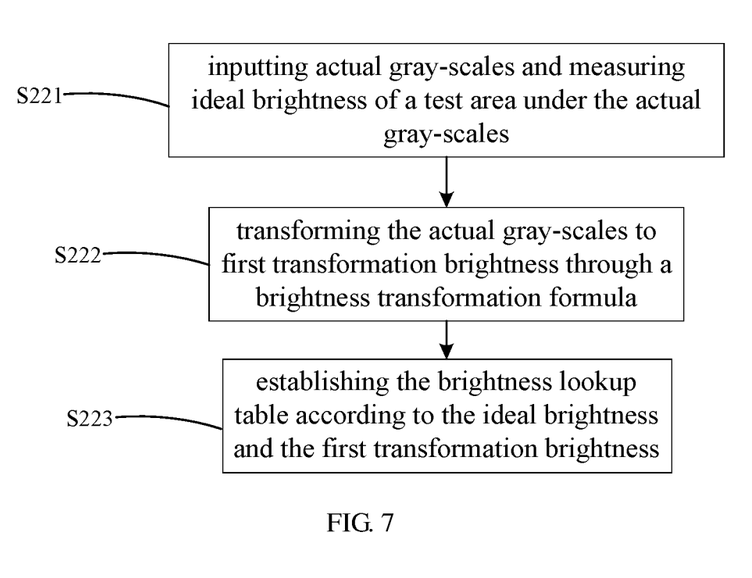
FIG. 7 is a flow chart of optical compensation detection in another compensation method for an electroluminescence display panel provided by an embodiment of the present disclosure.

FIG. 7 is a flow chart of an example of the optical compensation detection in the compensation method illustrated in FIG. 4. That is, FIG. 7 is an operational flow chart of an example of the step S220 in FIG. 4.

Referring to FIG. 7, the example of the optical compensation detection comprises the following steps S221-S223:

Step S221: inputting actual gray-scales and measuring ideal brightness of a test area under the actual gray-scales;

Step S222: transforming the actual gray-scales to first transformation brightness through a brightness transformation formula; and Step S223: establishing the brightness lookup table according to the ideal brightness and the first transformation brightness.

For example, in the step S221, the number of the actual gray-scales is at least one. For example, in one example, the number of the actual gray-scales may be 40. The more the number of the actual gray-scales, the more the measured data, and the more the correspondence between the actual gray-scales and the ideal brightness of the electroluminescent display panel can be reflected.

The area of the test area may be determined according to actual needs, and the test area may comprise one or more sub-pixels. The smaller the area of the test area of the display panel (i.e., the fewer sub-pixels the test area comprises), the more the ideal brightness of the test area can represent the ideal brightness of each sub-pixel within the test area. The larger the area of the test area, the smaller the test workload, and the simpler the test.

It should be noted that the ideal brightness of the test area represents the average value of the ideal brightness of all the sub-pixels in the test area.

For example, when the test data is limited and the correspondence between the actual gray-scales and the ideal brightness needs to be represented in more detail, a gray-scale lookup table may be established. The gray-scale lookup table may be expressed as:

$$GLo = LUTC(GL)$$

where GLo represents the actual gray-scale, and GL represents the ideal gray-scale.

In the present disclosure, "ideal brightness" is brightness corresponding to "ideal gray-scale", and as described above, "ideal brightness" may be obtained by measuring the brightness of the test area when the actual gray-scale is applied to the test area.

Through the brightness transformation formula described above, the ideal brightness corresponding to the ideal gray-scale can be calculated, and the detailed correspondence between the ideal gray-scales and the ideal brightness is obtained. Combined with the correspondence obtained by testing between the actual gray-scales and the ideal brightness, the gray-scale lookup table representing the detailed correspondence between the actual gray-scales and the ideal gray-scales can be established. For example, when the corresponding actual gray-scale needs to be obtained according to the ideal brightness, first the ideal gray-scale corresponding to the ideal brightness may be calculated by the brightness transformation formula, and then the corresponding actual gray-scale is found according to the gray-scale lookup table.

In the step S222, first the actual gray-scale is calculated according to the following formula:

$$L_o = \left(\frac{GL_o}{2^n}\right)^\gamma \times (2^i - 1),$$

where Lo represents the brightness transformed from the actual gray-scale, GLo represents the actual gray-scale, n represents the precision bits, γ represents the gamma curve factor, and i represents the operation digits. The values of n, γ, and i may be set according to actual needs, or may be selected in a conventional manner in the art. For example, n=10, γ=2.2, and i=20, which are not limited in the embodiments of the present disclosure. Then the first transformation brightness is calculated through the following formula:

$$\sqrt{L_o} = \sqrt{\left(\frac{GL_o}{2^n}\right)^\gamma \times (2^i - 1)}$$

where $\sqrt{L_o}$ represents the first transformation brightness, and the other parameters in the formula have the same meanings as above.

In the step S223, according to the correspondence between the ideal brightness and the actual gray-scales obtained in the step S221 and the correspondence between the first transformation brightness and the actual gray-scales obtained in the step S222, the brightness lookup table may be established. The brightness lookup table may represent the correspondence between the first transformation brightness and the ideal brightness. The brightness lookup table may be expressed as:

$$\sqrt{L_o} = \mathrm{LUTD}(L),$$

where $\sqrt{L_o}$ represents the first transformation brightness, and L represents the ideal brightness.

Figure 8:
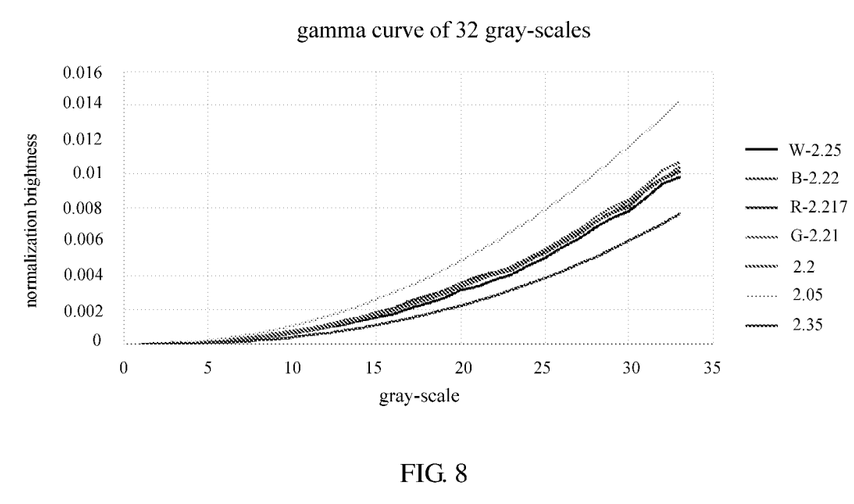
FIG. 8 is a curve of a gamma adjustment result of optical compensation detection provided by an embodiment of the present disclosure.

FIG. 8 is a curve of a gamma adjustment result of the optical compensation detection as illustrated in FIG. 7. Referring to FIG. 8, when the gamma curve factor is of different values, the nonlinearity degree of the gray-scale and the brightness is different. When the gamma curve factor is 2.05, 2.2, and 2.35 respectively, the nonlinearity degree of the gray-scale and the brightness gradually increases, that is, the larger the gamma curve factor, the greater the nonlinearity degree of the gray-scale and the brightness. When the gamma curve factor is 2.2, the adjustment effect is preferable. For different display colors, the values of the gamma curve factor are slightly different in order to achieve preferable adjustment effects. For example, when the display color is red, the adjustment effect is preferable when the gamma curve factor is 2.217. When the display color is green, the adjustment effect is preferable when the gamma curve factor is 2.21. When the display color is blue, the adjustment effect is preferable when the gamma curve factor is 2.22.

Figure 9:
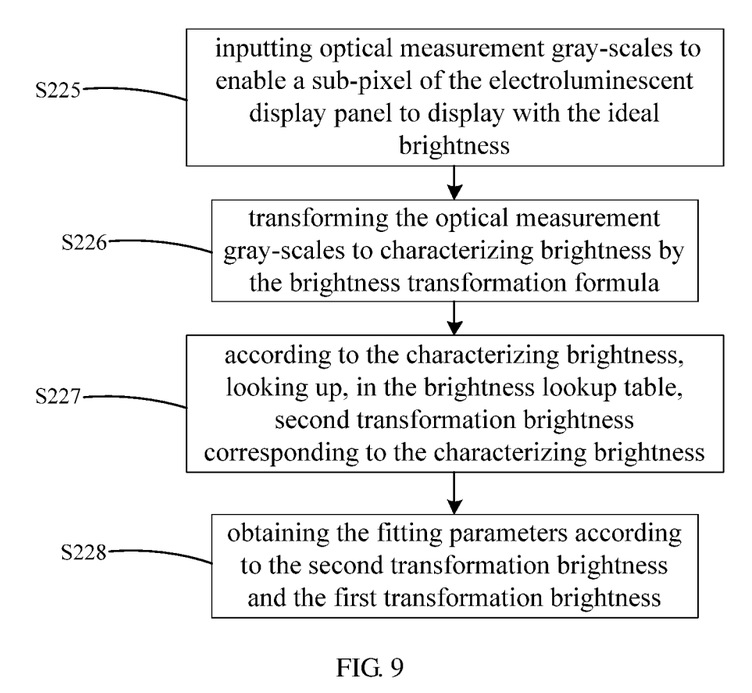
FIG. 9 is a flow chart of another optical compensation detection in another compensation method for an electroluminescence display panel provided by an embodiment of the present disclosure.

FIG. 9 is a flow chart of another example of the optical compensation detection in the compensation method illustrated in FIG. 4. That is, FIG. 9 is another operational flow chart of an example of the step S220 in FIG. 4.

Referring to FIG. 9, the example of the optical compensation detection comprises the following steps S225-S228:

Step S225: inputting optical measurement gray-scales to enable a sub-pixel of the electroluminescent display panel to display with the ideal brightness;

Step S226: transforming the optical measurement gray-scales to characterizing brightness by the brightness transformation formula;

Step S227: according to the characterizing brightness, looking up, in the brightness lookup table, second transformation brightness corresponding to the characterizing brightness; and Step S228: obtaining the fitting parameters according to the second transformation brightness and the first transformation brightness.

In the optical compensation detection process as illustrated in FIG. 7, the test area comprises one or more sub-pixels, and when the test area comprises a plurality of sub-pixels, the ideal brightness of each sub-pixel deviates from the ideal brightness of the test area. Therefore, each sub-pixel may be further detected through the optical detection process illustrated in FIG. 9 to obtain the fitting parameters of each sub-pixel, thereby further improving the display uniformity.

In the step S225, the input gray-scale is input to each sub-pixel of the electroluminescent display panel and is adjusted to enable each sub-pixel of the electroluminescent display panel to reach the ideal brightness, and the input gray-scale at this time is the optical measurement gray-scale.

In the step S226, the characterizing brightness is expressed as:

$$L' = \left(\frac{GL'}{2^n}\right)^\gamma \times (2^i - 1),$$

where L' represents the characterizing brightness, GL' represents the optical measurement gray-scale, and the other parameters in the formula have the same meanings as above.

In the step S227, the second transformation brightness corresponding to the characterizing brightness is found in the brightness lookup table LUTD, and the second transformation brightness is expressed as follow:

$$\sqrt{L'_o} = \mathrm{LUTD}(L'),$$

where $\sqrt{L'_o}$ represents the second transformation brightness.

In the step S228, the optical measurement gray-scale can be transformed to the first transformation brightness through the brightness transformation formula, that is, the first transformation brightness corresponds to the optical measurement gray-scale. The way to obtain the fitting parameters is not limited, and the linear interpolation may be adopted, or other suitable methods also may be adopted. For example, when the linear interpolation is adopted, the following formula is established according to the first transformation brightness and the second transformation brightness:

$$\sqrt{L'_o} = k1 \times \sqrt{Lo} + k2,$$

where $\sqrt{L'_o}$ represents the second transformation brightness, $\sqrt{Lo}$ represents the first transformation brightness, and k1 and k2 represent the fitting parameters. Thereby, the fitting parameters of each sub-pixel can be obtained. The number of the fitting parameters is not limited, the number of the fitting parameters may be two or an arbitrary number (for example, one, three, four, or the like), and may be determined according to the adopted fitting method.

By compensating for the electroluminescent display panel through the compensation methods illustrated in FIG. 4, FIG. 5, FIG. 7, and FIG. 9, the optical compensation parameters and the electrical compensation parameters can be obtained and be used in the optical compensation and the electrical compensation when displaying. The compensation method is capable of combining the advantages of the optical compensation mode and the electrical compensation mode, that is, the compensation method is capable of compensating for the display non-uniformity as well as achieving the real-time compensation, thereby improving the compensation effect and the display quality.

Figure 10:
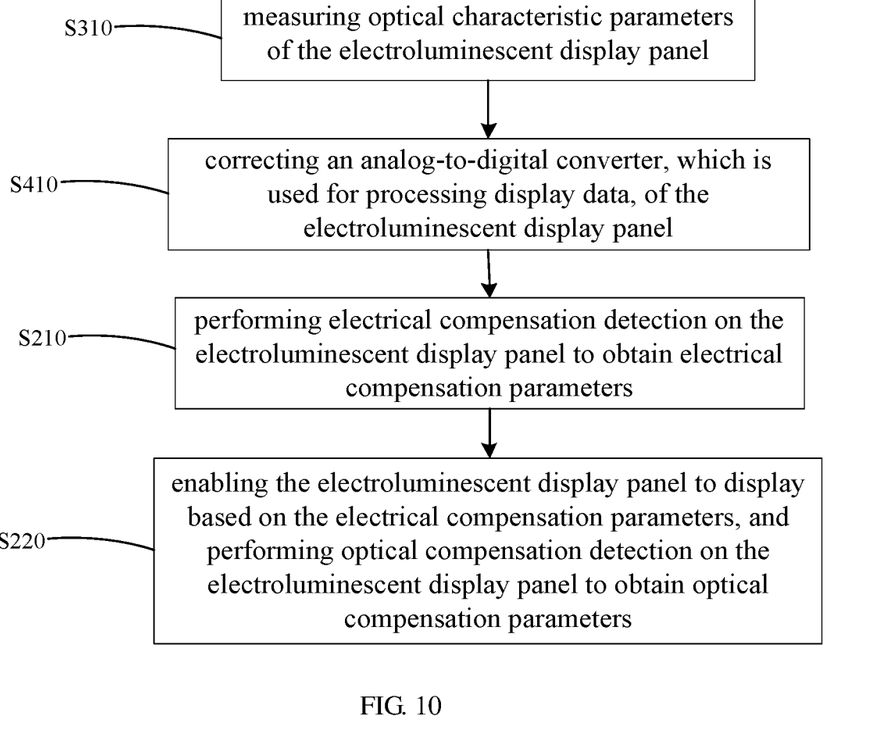
FIG. 10 is a flow chart of still another compensation method for an electroluminescence display panel provided by an embodiment of the present disclosure.

FIG. 10 is a flow chart of another compensation method for an electroluminescent display panel provided by an embodiment of the present disclosure. Referring to FIG. 10, the compensation method is substantially the same as the compensation method in FIG. 4 described above except for steps S310 and S410. The optical characteristic parameters described in the step S310 comprise, but are not limited to, the maximum brightness, the chrominance information, and the like, which are used conveniently in the subsequent compensation operations. In the step S410, for example, correcting an analog-to-digital converter (ADC) may comprise the following steps: inputting the same voltage to each analog-to-digital converter to obtain a conversion result; repeating the above step to obtain a plurality of conversion results, and averaging the conversion results to obtain a conversion result average value of each analog-to-digital converter; averaging a plurality of conversion result average values of the analog-to-digital converters to obtain a reference average value; and according to the reference average value, compensating for the conversion result of each analog-to-digital converter when the conversion is performed. Of course, the embodiments of the present disclosure comprise, but are not limited to, the method described above, and the method of correcting the analog-to-digital converter is not limited and may be determined according to actual needs. Through the correction, the conversion data of the analog-to-digital converter can be uniform, and the consistency and accuracy of the conversion result can be improved.

In the embodiments of the present disclosure, the sequence of the step S310 and the step S410 is not limited, and it may also be selected according to actual needs whether to perform the step S310 or the step S410 or not. The compensation method of this embodiment can improve the detection precision of the electrical compensation and the optical compensation, thereby obtaining more accurate electrical compensation parameters and optical compensation parameters.

It should be noted that, in the embodiments of the present disclosure, at least part of steps of the compensation method for an electroluminescent display panel may be implemented through software, hardware, firmware, or any combination thereof. Similarly, the process of the compensation method for an electroluminescence display panel may comprise more or fewer operations, which may be performed sequentially or in parallel. Although the process of the compensation method described above comprises a plurality of operations occurring in a specific order, it should be clearly understood that the sequence of the operations is not limited. The process of the compensation method described above may be performed only once, may be performed several times according to a predetermined time interval or a predetermined condition, or may be set to be performed cyclically.

At least one embodiment of the present disclosure also provides a driving device, which comprises a processor, a memory, and one or more computer program modules. The one or more computer program modules are stored in the memory and configured to be executed by the processor. The one or more modules comprise the instructions for implementing the compensation method for an electroluminescent display panel provided by any one of the embodiments of the present disclosure. The driving device can achieve the compensation for the electroluminescent display panel, combine the advantages of the optical compensation mode and the electrical compensation mode, improve the compensation effect and the display uniformity, and improve the user's comfort.

Figure 11:
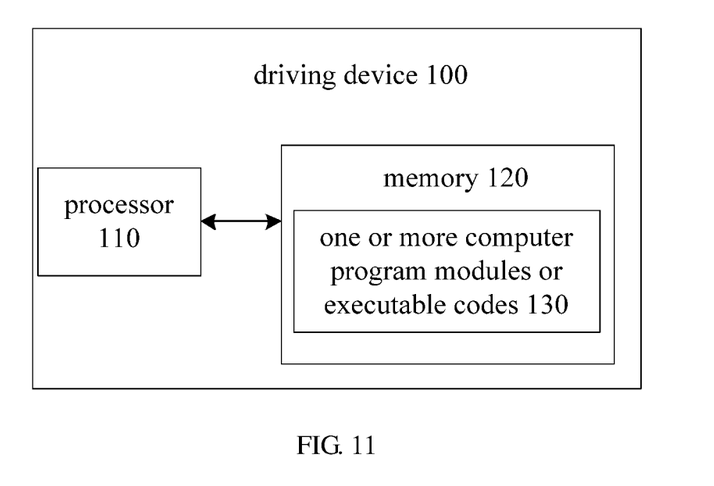
FIG. 11 is a block diagram of a driving device provided by an embodiment of the present disclosure.

FIG. 11 is a block diagram of a driving device provided by an embodiment of the present disclosure. Referring to FIG. 11, a driving device 100 comprises a processor 110, a memory 120, and one or more computer program modules or executable codes 130. The processor 110 is connected to the memory 120 through a communication bus. The one or more computer program modules or executable codes 130 are stored in the memory 120, and comprise the instructions for implementing the compensation method for an electroluminescent display panel provided by any one of the embodiments of the present disclosure. The one or more computer program modules or executable codes 130 may be executed by the processor 110. The communication bus may be a common serial communication bus or a common parallel communication bus, or may be a communication method such as Ethernet, fast Ethernet or the like, which is not limited in the embodiments of the present disclosure.

Figure 12:
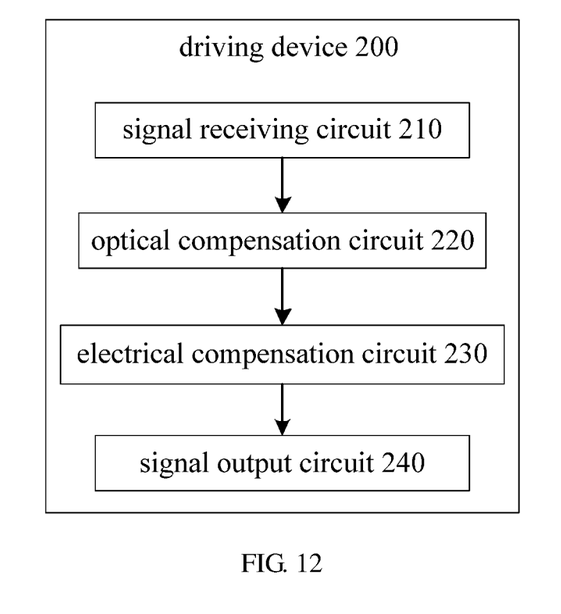
FIG. 12 is a block diagram of another driving device provided by an embodiment of the present disclosure.

FIG. 12 is a block diagram of another driving device provided by an embodiment of the present disclosure. Referring to FIG. 12, a driving device 200 comprises a signal receiving circuit 210, an optical compensation circuit 220, an electrical compensation circuit 230, and a signal output circuit 240. The signal receiving circuit 210 is configured to receive a first display data signal. The optical compensation circuit 220 is configured to perform an optical compensation operation on the first display data signal to obtain a second display data signal. The electrical compensation circuit 230 is configured to perform an electrical compensation operation on the second display data signal to obtain a third display data signal. The signal output circuit 240 is configured to output the third display data signal for display. In the embodiments of the present disclosure, more or fewer circuits may be comprised, and the connection relationship between the circuits is not limited and may be determined according to actual needs. The specific structure of each circuit is not limited, and may comprise analog devices according to the circuit principle, or may comprise digital chips or other suitable structures.

At least one embodiment of the present disclosure also provides an electroluminescent display device, which comprises the driving device provided by any one of the embodiments of the present disclosure. The display device can achieve the compensation for the input data, combine the advantages of the optical compensation mode and the electrical compensation mode, improve the compensation effect, improve the display uniformity, and improve the user's comfort.

Figure 13:
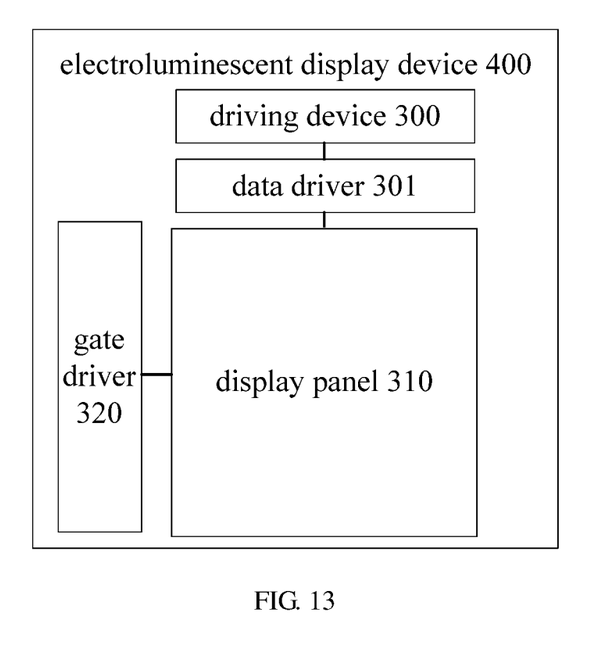
FIG. 13 is a block diagram of an electroluminescent display device provided by an embodiment of the present disclosure.

FIG. 13 is a block diagram of an electroluminescent display device provided by an embodiment of the present disclosure. Referring to FIG. 13, an electroluminescent display device 400 comprises a driving device 300. The electroluminescent display device 400 may be, but is not limited to, an organic light emitting diode (OLED) display device. The driving device 300 is the driving device provided by any one of the embodiments of the present disclosure.

For example, as illustrated in FIG. 13, the electroluminescent display device 400 may further comprise a display panel 310. The display panel 310 is configured to display images. After the image data to be displayed is input to the electroluminescence display device 400, the input image data are compensated by the driving device 300, and then the display panel 310 displays the compensated image data, thereby improving the display effect of the display panel, improving the display quality, and improving the display uniformity.

For example, the display panel 310 may be an electroluminescent display panel.

For example, as illustrated in FIG. 13, the electroluminescent display device 400 further comprises a gate driver 320. The display panel 310 comprises a plurality of sub-pixels, as illustrated in FIG. 6, each sub-pixel comprises a driving circuit and a light emitting device EL. The driving circuit comprises a driving transistor N0, a selection transistor T0, and a storage capacitor Cst. The gate driver 320 is further configured to be connected to the selection transistors T0 through a plurality of gate lines, so as to provide gate signals Scan to the selection transistors T0, thereby controlling the selection transistors T0 to be turned on or turned off.

For example, the electroluminescent display device 400 further comprises a data driver 301. The data driver 301 is configured to receive an output signal of the driving device 300, and then provide an image data signal to the display panel 310. The image data signal is a data voltage signal, and is used for controlling the luminous intensity of the light emitting device EL of the corresponding sub-pixel, so as make the corresponding sub-pixel present a certain gray-scale when displaying. The higher the voltage of the image data signal, the larger the gray-scale, thereby making the luminous intensity of the light emitting device EL larger. For example, the data driver may comprise a digital driver and an analog driver. The analog driver receives a red-green-blue (RGB) analog signal, and then outputs the RGB analog signal to the light emitting device EL of the sub-pixel through the thin film transistor of the sub-pixel. The digital driver receives a RGB digital signal, the RGB digital signal is converted into an analog signal through the digital/analog (D/A) conversion and gamma correction inside the data driver, and then the analog signal is output to the light emitting device EL of the sub-pixel through the thin film transistor of the sub-pixel.

For example, the data driver 301 and the gate driver 320 may be implemented by respective dedicated integrated circuit chips respectively, or may be implemented by being directly manufactured on the display panel 310 (e.g., an array substrate) through a semiconductor manufacture process.

At least one embodiment of the present disclosure further provides a storage medium. The storage medium is configured to store non-transitory computer executable instructions. When the non-transitory computer executable instructions are executed by a computer, the compensation method for an electroluminescent display panel provided by any one of the embodiments of the present disclosure is implemented.

Figure 14:
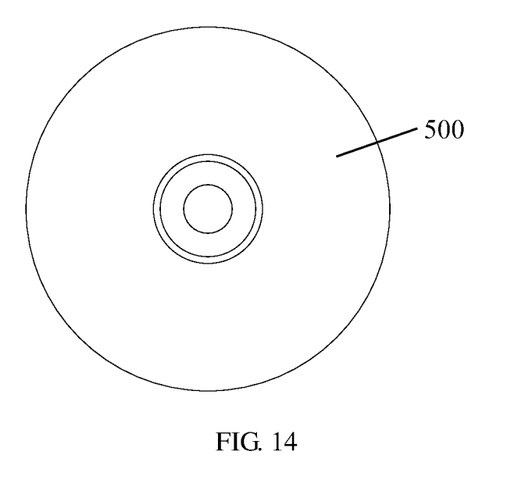
FIG. 14 is a schematic diagram of a storage medium provided by an embodiment of the present disclosure.

FIG. 14 is a schematic diagram of a storage medium provided by an embodiment of the present disclosure. Referring to FIG. 14, the storage medium may be an optical disc 500. The optical disc 500 may be, but is not limited to, a compact disc read-only memory (CD-ROM), a digital versatile disk read-only memory (DVD-ROM), a compact disc rewritable (CD-RW), a digital versatile disc random access memory (DVD-RAM), or the like. Computer executable instructions are non-transitorily stored in the optical disc 500. When the optical disc 500 is read by a computer through an optical disc driver, the computer can execute the instructions stored in the optical disc 500 to perform the compensation method for an electroluminescent display panel provided by any one of the embodiments of the present disclosure. In the embodiments of the present disclosure, the storage medium is not limited, and may be the optical disc 500, or may be a floppy disk, a hard disk, a flash memory, a double-rate synchronous dynamic random access memory (DDR SDRAM), a USB flash disc, a CF card, a SD card, a multimedia card (MMC), a SM card, a memory stick, a xD card, or other suitable storage medium.

The following is to be noted:

(1) The drawings of the present disclosure only relate to the structures relevant to the embodiments of the present disclosure, and other structures may be referred to the common design;

(2) In the case of no conflict, the embodiments of the present disclosure and the features of the embodiments may be combined with each other to obtain new embodiments.

What have been described above are only specific implementations of the present disclosure, the protection scope of the present disclosure is not limited thereto, and the protection scope of the present disclosure should be based on the protection scope of the claims.

What is claimed is:

1. A compensation method for an electroluminescent display panel, comprising:
   receiving a first display data signal;
   performing an optical compensation operation on the first display data signal to obtain a second display data signal;
   performing an electrical compensation operation on the second display data signal to obtain a third display data signal; and
   outputting the third display data signal for display,
   wherein the optical compensation operation compensates the first display data signal based on optical compensation parameters, wherein the optical compensation parameters comprises a brightness lookup table and fitting parameters,
   wherein the brightness lookup table comprises ideal brightness, and the brightness lookup table is generated based on optical compensation detection, and the fitting parameters are generated based on the brightness lookup table and further on optical compensation detection.

2. The compensation method according to claim 1, wherein the optical compensation operation comprises:
   obtaining the brightness lookup table;

according to the first display data signal, obtaining first transformation brightness corresponding to the first display data signal from the brightness lookup table;
obtaining the fitting parameters; and
obtaining the second display data signal according to the first transformation brightness and the fitting parameters.

3. The compensation method according to claim 1, wherein the electrical compensation operation comprises:
obtaining electrical compensation parameters; and
obtaining the third display data signal according to the second display data signal and the electrical compensation parameters.

4. The compensation method according to claim 3, wherein the third display data signal is expressed as:

$$GL_e = k \times \sqrt{L'} + Vth,$$

where $GL_e$ represents the third display data signal, $\sqrt{L'}$ represents the second display data signal, and Vth and k represent the electrical compensation parameters.

5. A driving device, comprising:
a processor; a memory; and
one or more modules which are stored in the memory and configured to be executed by the processor, and comprise instructions for implementing the compensation method according to claim 1.

6. An electroluminescent display device, comprising the driving device according to claim 5.

7. The electroluminescent display device according to claim 6, further comprising a data driver and a display panel,
wherein the driving device is coupled to the data driver to provide the third display data signal to the data driver, and
the data driver is coupled to the display panel to apply data voltages to the display panel.

8. A storage medium, for non-transitorily storing computer executable instructions, when the computer executable instructions are executed by a computer, the compensation method according to claim 1 is implemented.

9. A compensation method for an electroluminescent display panel, comprising:
receiving a first display data signal;
performing an optical compensation operation on the first display data signal to obtain a second display data signal;
performing an electrical compensation operation on the second display data signal to obtain a third display data signal; and
outputting the third display data signal for display,
wherein the optical compensation operation comprises:
obtaining a brightness lookup table;
according to the first display data signal, obtaining first transformation brightness corresponding to the first display data signal from the brightness lookup table;
obtaining fitting parameters; and
obtaining the second display data signal according to the first transformation brightness and the fitting parameters,
wherein the second display data signal is expressed as:

$$\sqrt{L'} = k1 \times \sqrt{Lo} + k2,$$

where $\sqrt{L'}$ represents the second display data signal, $\sqrt{L'}$ represents the first transformation brightness, and k1 and k2 represent the fitting parameters.

10. The compensation method according to claim 9, wherein the electrical compensation operation comprises:
obtaining electrical compensation parameters; and
obtaining the third display data signal according to the second display data signal and the electrical compensation parameters.

11. The compensation method according to claim 10, wherein the third display data signal is expressed as:

$$GL_e = k \times \sqrt{L'} + Vth,$$

where $GL_e$ represents the third display data signal, $\sqrt{L'}$ represents the second display data signal, and Vth and k represent the electrical compensation parameters.

12. A driving device, comprising:
a signal receiving circuit, configured to receive a first display data signal;
an optical compensation circuit, configured to perform an optical compensation operation on the first display data signal to obtain a second display data signal;
an electrical compensation circuit, configured to perform an electrical compensation operation on the second display data signal to obtain a third display data signal; and
a signal output circuit, configured to output the third display data signal for display,
wherein the optical compensation operation compensates the first display data signal based on optical compensation parameters, wherein the optical compensation parameters comprises a brightness lookup table and fitting parameters,
wherein the brightness lookup table comprises ideal brightness, and the brightness lookup table is generated based on optical compensation detection, and the fitting parameters are generated based on the brightness lookup table and further on optical compensation detection.

* * * * *